United States Patent
Behboodian et al.

(10) Patent No.: US 7,110,559 B2
(45) Date of Patent: Sep. 19, 2006

(54) SYSTEM AND METHOD FOR CONTROLLING AUDIO OUTPUT

(75) Inventors: Ali Behboodian, Plantation, FL (US); Audley F. Patterson, Miramar, FL (US)

(73) Assignee: Motorola, Inc., Schaumburg, IL (US)

( * ) Notice: Subject to any disclaimer, the term of this patent is extended or adjusted under 35 U.S.C. 154(b) by 61 days.

(21) Appl. No.: 10/702,714

(22) Filed: Nov. 6, 2003

(65) Prior Publication Data
US 2005/0100179 A1 May 12, 2005

(51) Int. Cl.
H03G 7/00 (2006.01)
H03G 3/00 (2006.01)
H04R 29/00 (2006.01)

(52) U.S. Cl. ............... 381/106; 381/104; 381/107; 381/58

(58) Field of Classification Search ............ 381/106, 381/104, 107, 120; 333/14; 330/251, 207 A
See application file for complete search history.

(56) References Cited

U.S. PATENT DOCUMENTS

| | | | |
|---|---|---|---|
| 5,892,834 A * | 4/1999 | Smart et al. | 381/106 |
| 6,373,340 B1 | 4/2002 | Shashoua | |
| 6,765,436 B1 * | 7/2004 | Melanson et al. | 330/10 |
| 2003/0044028 A1* | 3/2003 | Cranfill et al. | 381/107 |

* cited by examiner

*Primary Examiner*—Laura A. Grier
(74) *Attorney, Agent, or Firm*—Larry G. Brown

(57) ABSTRACT

The invention concerns a method (300) and system (100) for controlling audio output. The method includes the steps of inputting (312) an audio signal and a voltage level signal, measuring (314) the audio signal and the voltage level signal, mapping (316) the audio signal against at least one table (134) of predetermined corresponding gain targets (138) and selecting (318) at least one gain target for the audio signal. The mapping step and the selecting step are based at least in part on the measurement of the voltage level signal and the measurement of the audio signal. The method also includes the step of applying (320) the gain target to the audio signal.

12 Claims, 4 Drawing Sheets

SYSTEM AND METHOD FOR CONTROLLING AUDIO OUTPUT

CROSS REFERENCE TO RELATED APPLICATIONS (Not Applicable)

BACKGROUND

1. Technical Field

This invention relates in general to handheld devices and more particularly, to audio systems for such devices.

2. Description of the Related Art

Many handheld devices, such as personal digital assistants (PDA), mobile telecommunications units and gaming units, use batteries to power their electronics. In most of these devices, one or more speakers are included to broadcast voices or digitally generated tones, such as musical notes.

In general, a power amplifier is used to drive the speakers in these devices. The batteries in these devices supply voltage directly to the power amplifier. As a result, the output of the power amplifier is dependent on the voltage supplied by the batteries. Because of this relationship, as the charge on the batteries begins to drop, the output of the power amplifier is affected. Notably, however, the signal input to the power amplifier, which has a much lower voltage level than that of the output of the power amplifier, is literally independent of the battery voltage swings.

Accordingly, when the battery voltage drops, the output signal from the power amplifier may be clipped. This clipping will produce low quality audio, and the user of the device may hear a distorted signal when it is broadcast from the speaker. Thus, there is a need for a system and method for maintaining the quality of audio generated by a device that outputs audio when the power supply of that device begins to deteriorate.

SUMMARY OF THE INVENTION

The present invention concerns a method for controlling audio output. The method includes the steps of inputting an audio signal and a voltage level signal, measuring the audio signal and the voltage level signal, mapping the audio signal against at least one table of predetermined corresponding gain targets, selecting at least one gain target for the audio signal and applying the gain targets to the audio signal. The mapping step and the selecting step are based at least in part on the measurement of the voltage level signal and the measurement of the audio signal.

In one arrangement, at least a portion of the predetermined corresponding gain targets can describe at least one transfer function that can compress the audio signal, which can reduce clipping of the audio signal. In addition, as the value of the audio signal increases as determined during the measuring step, the selection of the gain targets can be such that the compression of the audio signal is increased.

In another arrangement, the mapping step can further include mapping the audio signal against one of a plurality of tables of predetermined corresponding gain targets. At least a portion of the predetermined corresponding gain targets for a first table can describe at least one transfer function that can compress the audio signal, and the predetermined corresponding gain targets for each successive table can describe at least one transfer function that can compress the audio signal to a greater degree than transfer functions described by the corresponding gain targets of a previous table. Each of the tables can correspond to one of a plurality of predetermined ranges of the voltage level signal. Also, as the voltage level signal decreases and falls from a first predetermined range to a second predetermined range, the table against which the audio signal is mapped can contain predetermined corresponding gain targets that can describe at least one transfer function that can result in an increase in the compression of the audio signal as compared to the transfer functions described by the corresponding gain targets of a previous table.

The inputting, measuring, mapping, selecting and applying steps can be performed in a communication device. The communication device can have a power amplifier coupled to a speaker, and the method can further include the step of outputting the audio signal to the power amplifier. Also, the method can further include the step of digitizing the voltage level signal prior to the inputting step. In another arrangement, when the audio signal is measured to be below a predetermined threshold, the predetermined corresponding gain targets selected from the table describe a transfer function of unity.

The present invention also concerns a system for controlling audio output. The system includes a feedback loop and a compressor. The feedback loop inputs a voltage level signal to the compressor, and the compressor samples an audio signal. The compressor can measure the audio signal and the voltage level signal, map the audio signal against at least one table of predetermined corresponding gain targets, select at least one gain target for the audio signal and apply the gain targets to the audio signal. The compressor maps the audio signal and selects the gain targets based at least in part on the measurement of the audio signal and the measurement of the voltage level signal. The system also includes suitable software and circuitry to carry out the processes described above.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
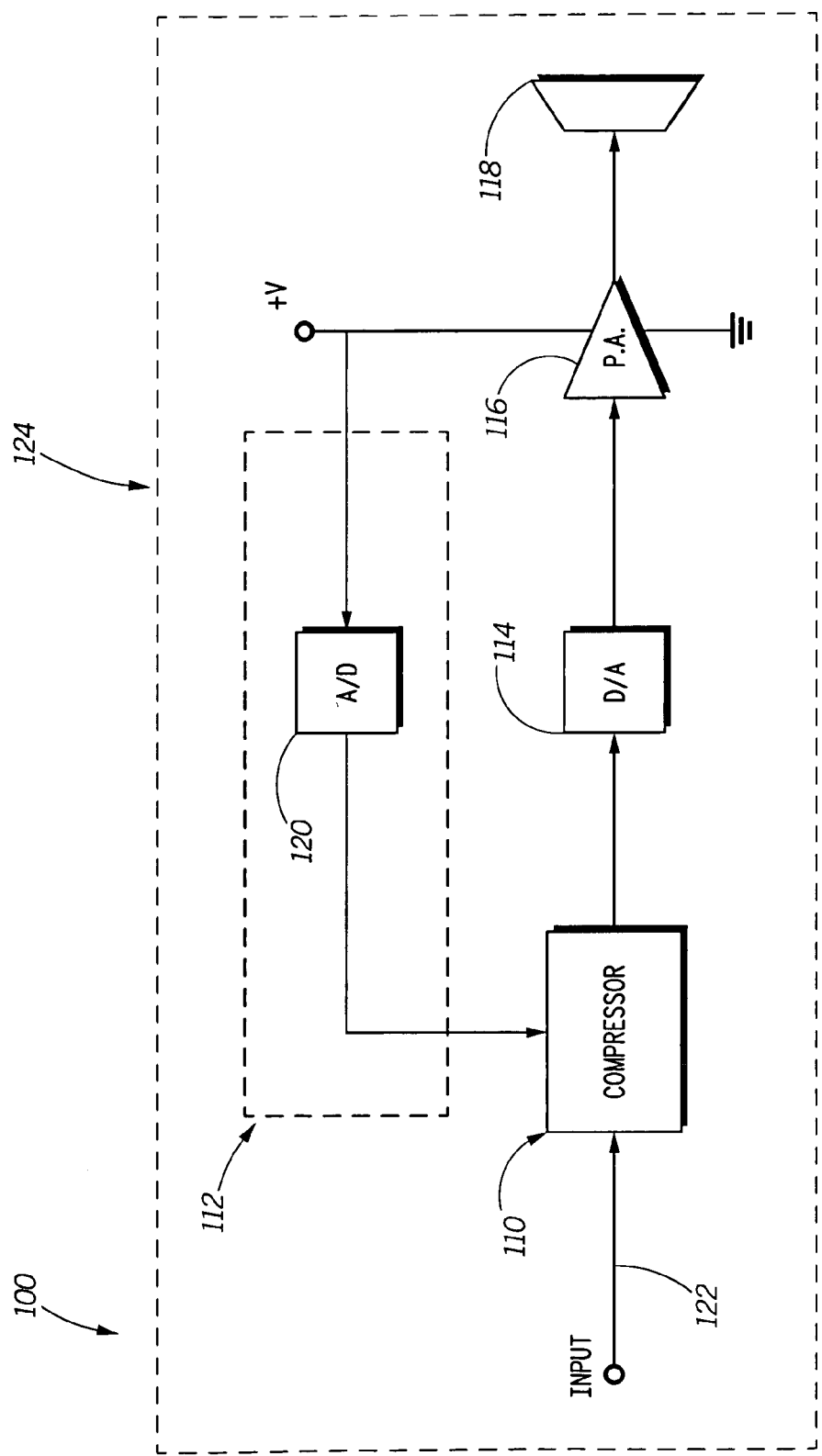
FIG. 1 illustrates a system for controlling audio output in accordance with the inventive arrangements.

While the specification concludes with claims defining the features of the invention that are regarded as novel, it is believed that the invention will be better understood from a consideration of the following description in conjunction with the drawing figures, in which like reference numerals are carried forward.

Referring to FIG. 1, a system 100 for controlling audio output is shown. The system 100 can include a compressor 110, a feedback loop 112, a digital-to-analog (D/A) converter 114, a power amplifier 116 and a speaker 118. The feedback loop 112 may contain an analog-to-digital (A/D) converter 120. Furthermore, an input 122 can be coupled to the compressor 110, and the compressor 110 can be coupled to the D/A converter 114. The D/A converter 114 can be coupled to the power amplifier 116, which can be coupled to the speaker 118. A voltage supply +V can be coupled to the power amplifier 116, and the feedback loop 112 can couple the voltage supply +V to the compressor 110 through the A/D converter 120. As such, a voltage level signal can be fed to the compressor 110 through the feedback loop 112. In one arrangement, each of the components listed above can be part of a communications device 124, such as a mobile phone or a personal digital assistant. Of course, the invention is not limited in this regard, as each of these components can be part of any other suitable device. Moreover, those of ordinary skill in the art will appreciate that the system 100 is not limited to the components shown.

The input 122 can input, for example, digital audio signals to the compressor 110, and, as will be explained later, the compressor 110 can modify the audio signals. The compressor 110 can then transfer the audio signals to the D/A converter 114, which can convert the audio signals to an analog signal and forward them to the power amplifier 116. The power amplifier 116 can drive the speaker 118, and the speaker 118 can broadcast the audio signals.

In one arrangement, the A/D converter 120 can digitize the voltage level signal from the voltage supply +V, and the compressor 110, through the feedback loop 112, can monitor or measure this voltage level signal. Additionally, the compressor 110 can measure the input audio signals. Based on these measurements, the compressor 110 can modify the audio signals. For example, if the compressor 110 determines that the voltage level signal, and hence the voltage supply +V, drops to a certain threshold, the compressor 110 can compress the audio signal, which can help prevent the audio signal from clipping. This process will be explained below in detail.

Figure 2:
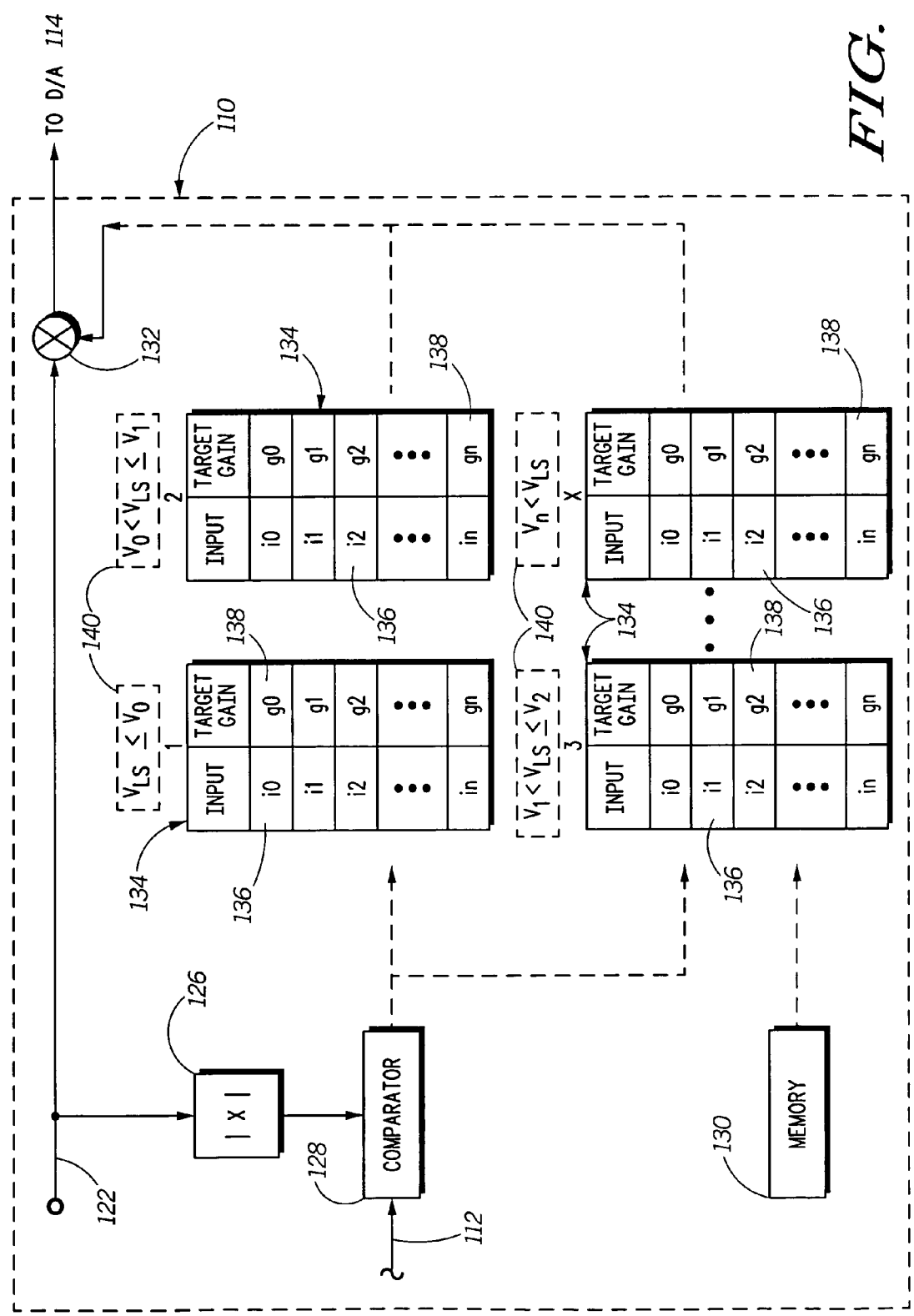
FIG. 2 illustrates in detail a component of the system of FIG. 1 in accordance with the inventive arrangements.

Referring to FIG. 2, some of the internal components of the compressor 110 are shown. As an example, the compressor 110 can include an absolute value component 126, a comparator 128, memory 130 and a gain component 132. At least one table 134 can be programmed into the memory 130, and the comparator 128 can have access to each of these tables 134. In one arrangement, each table 134 can include predetermined input measurements 136 and predetermined gain targets 138 that correspond to the predetermined input measurements 136. The input measurements 136 can be predetermined signal levels of, for example, an audio signal. Further, the corresponding gain targets 138 can describe at least one transfer function that, when applied to the input audio signal, can modify the signal, such as by compressing it. The invention can include any suitable number of tables 134, even just one. In one particular arrangement, each table 134 can be associated with or correspond to one of a plurality of predetermined ranges 140 of the voltage level signal. Any suitable number of predetermined ranges 140 can be employed in the invention.

Figure 3:
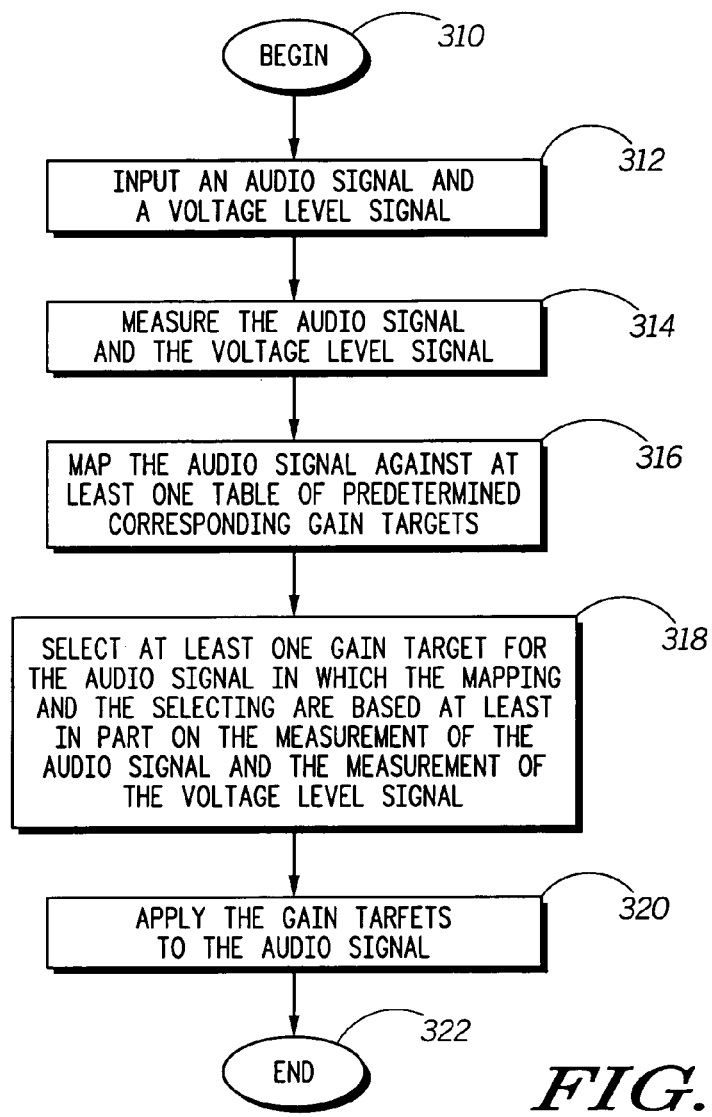
FIG. 3 illustrates a method for controlling audio output in accordance with the inventive arrangements.

Referring to FIG. 3, a method 300 of controlling audio output is illustrated. To explain the method 300, reference will be made to the components illustrated in FIGS. 1 and 2, although it must be noted that the method 300 can be practiced in any other suitable system. At step 310, the method 300 can begin, and at step 312, an audio signal, such as a digital audio signal, and a voltage level signal can be input. As an example and referring to FIGS. 1 and 2, an audio signal can be input into the comparator 128 of the compressor 110 through the input 122. In one arrangement, the absolute value component 126 can calculate the absolute value of the audio signal and transfer it to the comparator 128, as shown in FIG. 2. Additionally, as illustrated in FIGS. 1 and 2, a voltage level signal can be input to the comparator 128 of the compressor 110 through the feedback loop 112. As such, the comparator 128 is able to monitor the supply voltage +V that is being supplied to the power amplifier 116. In one arrangement, the A/D converter 120 can digitize the voltage level signal prior to the voltage level signal being fed to the comparator 128.

Referring back to the method 300 of FIG. 3, the audio signal and the voltage level signal can be measured, as shown at step 314. As an example, referring once again to FIGS. 1 and 2, the comparator 128 can measure the input audio signal received from the input 122 and the voltage level signal received from the feedback loop 112. Referring back to FIG. 3, at step 316, the audio signal can be mapped against at least one table of predetermined corresponding gain targets, and at step 318, at least one corresponding gain target can be selected. In one particular arrangement, the table against which the audio signal is mapped and the gain targets that are selected can be based at least in part on the measurement of the voltage level signal and the measurement of the audio signal.

As an example, referring to FIG. 2, after the comparator 128 has measured the voltage level signal, the comparator 128 can compare or map the audio signal against one of the tables 134. This mapping step can include the comparator 128 selecting a table 134 that corresponds to the predetermined range 140 in which the voltage level signal falls. For example, if the voltage level signal, which can be referred to as $V_{LS}$, is less than a predetermined value of $V_0$, then comparator 128 can map the audio signal against the table 134 designated by the reference numeral 1. As another example, if the $V_{LS}$ is higher than the predetermined value $V_1$ but less than or equal to the predetermined value $V_2$, the comparator 128 can map the audio signal against the table 134 designated by the reference numeral 3.

When the comparator 128 maps the audio signal against a particular table 134, the comparator 128 can compare the values of the input audio signal with the predetermined input measurements 136. Based on this comparison, the comparator 128 can then select the gain targets 138 that correspond to the input measurements 136 that match the values of the audio signal.

Referring back to the method 300 of FIG. 3, the gain targets can be applied to the signal, as shown at step 320, and the method 300 can end at step 322. As an example and referring back to FIG. 2, once the corresponding gain targets 138 have been selected, the gain component 132 can apply the selected gain targets 138 to the audio signal, which can then be transmitted to the D/A converter 114.

In one arrangement, at least a portion of the gain targets 138 in the table 134 against which the audio signal is mapped can describe at least one transfer function that compresses the audio signal. As such, when the comparator 128 detects a decrease in the supply voltage +V (see FIG. 1) when it measures the voltage level signal, the compression can reduce the chances that the audio signal will be clipped as a result of the lowered supply voltage +V.

Figure 4:
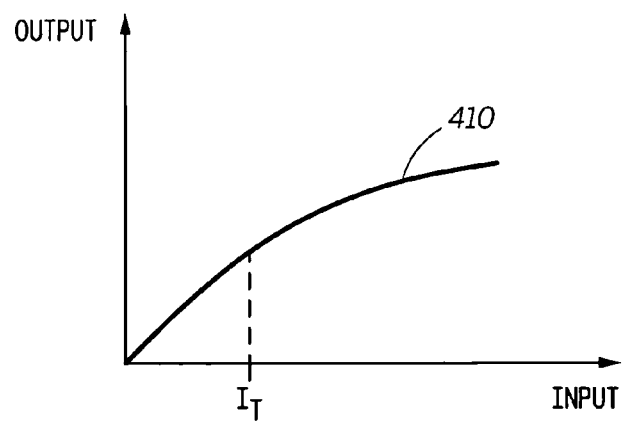
FIG. 4 illustrates a graph of a compression curve in accordance with the inventive arrangements.

In one particular arrangement, for a particular table 134, as the value of the input audio signal increases, corresponding gain targets 138 that describe at least one transfer function that provides greater compression can be selected. Conversely, as the value of the audio signal decreases, corresponding gain targets 138 that result in less or even no compression can be selected. An example of this process is illustrated in FIG. 4, which shows a graph of a compression curve that can be applied to an audio signal in which the graph can be based on the input audio values to, for example, the compressor 110 and the output audio values from, for example, the compressor 110. Referring to a curve 410, as the value of the input audio signal increases, the compression of the audio signal can increase. In one arrangement, if the value of the input audio signal remains at or below a predetermined threshold $I_T$, the audio signal can undergo little or no compression. As an example, when the input audio signal is at or below $I_T$, the corresponding gain targets 138 that the comparator 128 selects can describe a transfer function of one or unity. It is understood, however, that the invention is not limited in this regard, as compression of the audio signal may occur at any other suitable value or may not occur at all.

In another arrangement, referring back to FIG. 2, if a plurality of tables 134 are employed, the amount of compression can vary based on which particular table 134 is selected, i.e., against which table 134 the audio signal is mapped. For example, if the comparator 128 maps the audio signal against the table 134 represented by the reference numeral 2, the amount of compression provided by this table 134 can be less than that provided by the selection of the gain targets 138 of the table 134 designated by the reference numeral 1. The table 134 represented by the reference numeral 2 is associated with a higher voltage level signal than that of the table 134 represented by the reference numeral 1. Thus, for a higher voltage level signal, the compression of the audio signal can be less based on the selection of a particular table 134. Conversely, for a lower voltage level signal, the compression of the audio signal can be greater, as the table 134 against which the audio signal is mapped contains target gains 138 that result in greater compression of the audio signal.

This particular compression scheme can apply to all the tables 134 in the compressor 110 such that the gain targets 138 for a first table 134 describe at least one transfer function that compresses the audio signal, and the gain targets 134 for each successive table 134 can describe transfer functions that compress the audio signal to a greater degree than the transfer functions described by the gain targets 138 of previous tables 134. An example of this scheme is illustrated in FIG. 5, which shows a graph of several compression curves that can be applied to audio signals.

Figure 5:
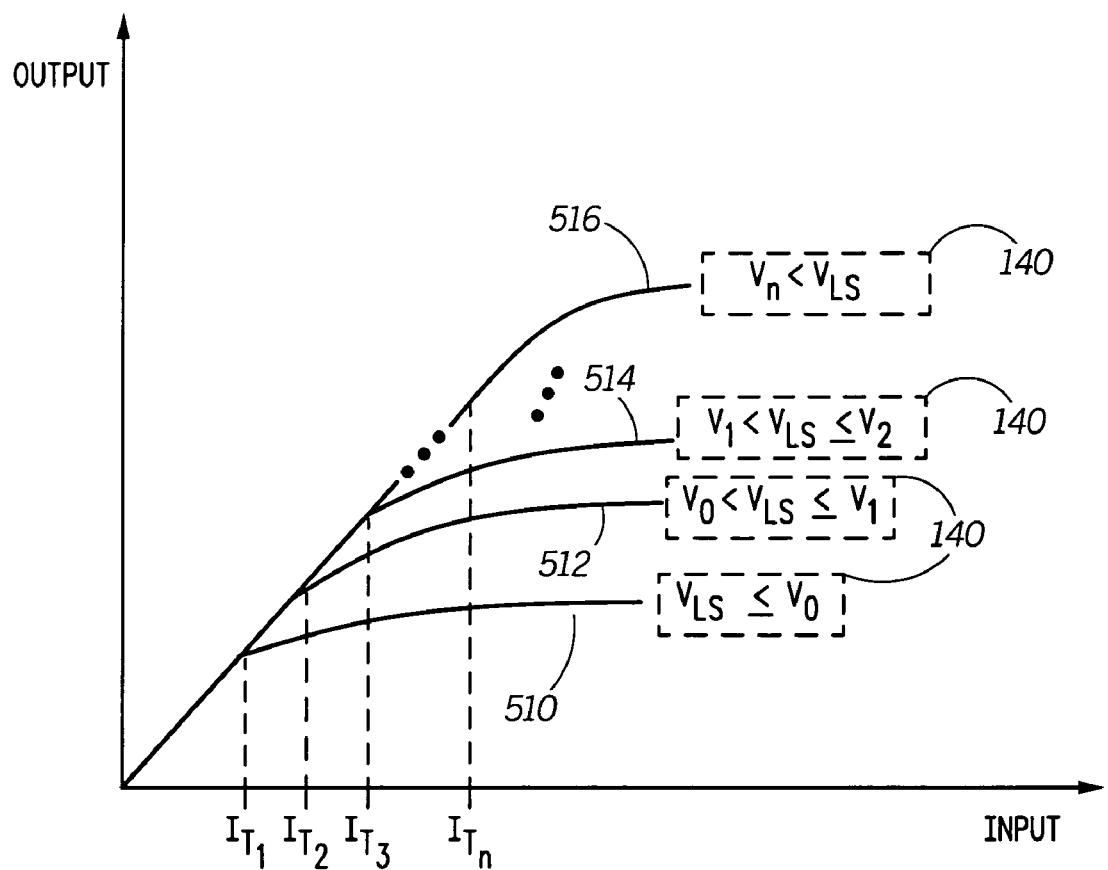
FIG. 5 illustrates a graph of a plurality of compression curves in accordance with the inventive arrangements.

In FIG. 5, curves 510, 512, 514 and 516 represent compression curves in which each curve can be associated with a particular table 134 and hence, a particular predetermined range 140 of the voltage level signal. For example, referring to FIGS. 2 and 5, the curve 510 can represent the compression curve to be applied to the audio signal when the audio signal has been mapped against the table 134 designated by the reference numeral 1. This table 134 is associated with the predetermined range 140 in which $V_{LS}$ is less than or equal to $V_0$. This predetermined range 140 is the lowest one into which the $V_{LS}$ may fall, and as such, a greater amount of compression may be needed to avoid clipping.

In contrast, if the $V_{LS}$ is within the highest predetermined range 140, in which the $V_{LS}$ is higher than the predetermined value $V_n$, then the audio signal can be mapped against the table 134 designated by the reference letter X. The gain targets 138 in this table 134 can describe transfer functions that result in less compression of the audio signal when compared to any of the previous tables 134. Because the supply voltage +V is higher in this example, the chances of the audio signal being clipped are reduced, and less compression is needed.

Eventually, the $V_{LS}$ may decrease and fall from a first predetermined range 140, such as where the $V_{LS}$ is greater than $V_n$, to a second predetermined range, such as where $V_{LS}$ is greater than $V_1$ but less than or equal to $V_2$. In accordance with the inventive arrangements, the audio signal can be mapped against a table 134 associated with the second predetermined range 140 that will result in greater compression as compared to its mapping against the previous table 134 associated with the first predetermined range 140. Thus, as the supply voltage +V gradually drops, greater compression of the audio signal can occur. In another arrangement, each of the curves 510–516 can include a predetermined threshold $I_T$ in which no or little compression can occur when the level of the audio signal is low, as described above in reference to FIG. 4.

It is understood that the invention can include any suitable number of predetermined ranges 140. Moreover, the invention is not limited to the level of compression illustrated in FIG. 4 or 5, as the audio signal can be modified in any other suitable manner. Those of ordinary skill in the art will appreciate that the invention is not limited to the processing of digital signals, as the compressor 110 (see FIG. 1) can be a compressor that processes analog signals. Although the processes described above can be performed in a communication device having a speaker, it is understood that the invention can be employed in any other suitable device.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for controlling audio output, comprising the steps of:

inputting an audio signal and a voltage level signal;

measuring the audio signal and the voltage level signal;

mapping the audio signal against at least one table of predetermined corresponding gain targets;

selecting at least one gain target for the audio signal, wherein said mapping step and said selecting step are based at least in part on the measurement of the voltage level signal and the measurement of the audio signal; and applying the gain targets to the audio signal, wherein at least a portion of the predetermined corresponding gain targets describes at least one transfer function that compresses the audio signal, which reduces clipping of the audio signal and wherein as the value of the audio signal increases as determined during said measuring step, the selection of the gain targets are such that the compression of the audio signal is increased;

wherein said mapping step further comprises mapping the audio signal against one of a plurality of tables of predetermined corresponding gain targets, wherein at least a portion of the predetermined corresponding gain targets for a first table describe at least one transfer function that compresses the audio signal and the predetermined corresponding gain targets for the next table describe at least one transfer function that compresses the audio signal to a greater degree than transfer functions described by the corresponding gain targets of a previous table.

2. The method according to claim 1, wherein each of the tables corresponds to one of a plurality of predetermined ranges of the voltage level signal.

3. The method according to claim 2, wherein as the voltage level signal decreases and falls from a first predetermined range to a second predetermined range, the table against which the audio signal is mapped contains predetermined corresponding gain targets that describe at least one transfer function that results in an increase in the compression of the audio signal as compared to the transfer functions described by the corresponding gain targets of a previous table.

4. The method according to claim 1, wherein said inputting, measuring, mapping, selecting and applying steps are performed in a communication device having a power amplifier coupled to a speaker, wherein said method further comprises the step of outputting the audio signal to the power amplifier.

5. The method according to claim 1, further comprising the step of digitizing the voltage level signal prior to said inputting step.

6. The method according to claim 1, wherein when the audio signal is measured to be below a predetermined threshold, the predetermined corresponding gain targets selected from the table describe a transfer function of unity.

7. A system for controlling audio output, comprising:
a feedback loop; and
a compressor, wherein said feedback loop inputs a voltage level signal to said compressor and said compressor samples an audio signal, said compressor:
  measures said audio signal and said voltage level signal;
  maps said audio signal against at least one table of predetermined corresponding gain targets;
  selects at least one said gain target for said audio signal, wherein said compressor maps said audio signal and selects said gain targets based at least in part on the measurement of said audio signal and the measurement of said voltage level signal; and
  applies said gain targets to said audio signal, wherein at least a portion of said predetermined corresponding gain targets describes at least one transfer function that compresses said audio signal, which reduces clipping of said audio signal and wherein as said compressor measures an increase in the value of said audio signal, said compressor selects said gain targets that cause an increase in the compression of said audio signal;
wherein said compressor further maps said audio signal against one of a plurality of said tables of said predetermined corresponding gain targets, wherein at least a portion of said predetermined corresponding gain targets for a first table describe at least one transfer function that compresses said audio signal and said predetermined corresponding gain targets for the next table describe at least one transfer function that compresses said audio signal to a greater degree than transfer functions described by said corresponding gain targets of a previous table.

8. The system according to claim 7, wherein each of said tables corresponds to one of a plurality of predetermined ranges of said voltage level signal.

9. The system according to claim 8, wherein as said compressor measures a decrease in said voltage level signal such that said voltage level signals falls from a first predetermined range to a second predetermined range, said compressor maps said audio signal against a table that contains predetermined corresponding gain targets that describe at least one transfer function that results in an increase in the compression of said audio signal as compared to transfer functions described by said corresponding gain targets of a previous table.

10. The system according to claim 7, further comprising a power amplifier and a speaker, wherein said power amplifier is coupled to said speaker and said compressor, said feedback loop, said power amplifier and said speaker are contained within a communication device.

11. The system according to claim 7, further comprising an analog-to-digital converter, wherein said analog-to-digital converter digitizes said voltage level signal prior to said feedback loop inputting said voltage level signal to said compressor.

12. The system according to claim 7, wherein when said compressor measures said audio signal to be below a predetermined threshold, said predetermined corresponding gain targets selected from said table describe a transfer function of unity.

* * * * *